(12) United States Patent
Wedlake

(10) Patent No.: US 8,179,153 B2
(45) Date of Patent: May 15, 2012

(54) PROBE APPARATUS, A PROCESS OF FORMING A PROBE HEAD, AND A PROCESS OF FORMING AN ELECTRONIC DEVICE

(75) Inventor: Michael D. Wedlake, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 560 days.

(21) Appl. No.: 12/174,743

(22) Filed: Jul. 17, 2008

(65) Prior Publication Data

US 2010/0013504 A1    Jan. 21, 2010

(51) Int. Cl.
*G01R 31/20* (2006.01)
(52) U.S. Cl. .................................. 324/754.01
(58) Field of Classification Search ........................ None
See application file for complete search history.

(56) References Cited

U.S. PATENT DOCUMENTS

| | | | | |
|---|---|---|---|---|
| 5,689,193 | A * | 11/1997 | Matsuda | 324/756.03 |
| 7,241,689 | B2 * | 7/2007 | Kim et al. | 438/670 |
| 7,273,812 | B2 * | 9/2007 | Kim et al. | 438/670 |
| 7,412,767 | B2 * | 8/2008 | Kim et al. | 29/879 |
| 7,561,147 | B2 * | 7/2009 | Tsuge | 345/204 |
| 7,701,413 | B2 * | 4/2010 | Moon | 345/60 |
| 7,915,169 | B2 * | 3/2011 | Brannon et al. | 438/691 |
| 2005/0259040 | A1 * | 11/2005 | Moon | 345/60 |
| 2006/0053625 | A1 * | 3/2006 | Kim et al. | 29/874 |
| 2006/0112550 | A1 * | 6/2006 | Kim et al. | 29/884 |
| 2008/0017609 | A1 * | 1/2008 | Takahashi et al. | 216/52 |
| 2009/0001488 | A1 * | 1/2009 | Magana et al. | 257/428 |
| 2009/0139965 | A1 * | 6/2009 | Mathieu et al. | 219/69.17 |
| 2010/0155253 | A1 * | 6/2010 | Kim et al. | 205/122 |
| 2011/0121854 | A1 * | 5/2011 | Inoue et al. | 324/760.02 |
| 2011/0136268 | A1 * | 6/2011 | Brannon et al. | 438/5 |
| 2011/0199367 | A1 * | 8/2011 | Masazumi | 345/212 |

OTHER PUBLICATIONS

Bakir, Muhannad S., "Sea of Lands (SoL) Ultrahigh Density Wafer-Level Chip Input/Output Interconnections for Gigascale Integration (GSI)," IEEE Transactions on Electron Devices, vol. 50, No. 10, Oct. 2003, pp. 2039-2048.
Kelleher, Hollie A., "Air-Gaps Via Thermally Decomposable Polymers and Their Application to Compliant Wafer Level Packaging (CWLP)," A Dissertation Presented to the Academic Faculty, Georgia Institute of Technology, Dec. 2004, 500 pages.
Reed, Hollie A., "Fabrication of Microchannels using Polycarbonates as Sacrificial Materials," Journal of Micromechanics and Microengineering, Oct. 12, 2001, pp. 733-737.
Lawing, A. Scott, "Improving the Results of Post-CMP Wafer-Scale Thickness Measurements," Micro Magazine, 2007, pp. 1-11. <http://www.micromagazine.com/archive/02/01/Lawing.html>.

* cited by examiner

*Primary Examiner* — Jermele M Hollington

(57) ABSTRACT

A probing apparatus includes a set of conductors configured to contact a surface of a workpiece simultaneously. A processor activates subsets of the conductors to determine a four-point-probe parameter, wherein the subset is less than the set of conductors. Another subset determines another four-point-probe parameter. The set of conductors remain in contact with the surface of the workpiece during and between activating each subset. A process of forming a probe head includes a probe substrate and associated conductive leads. An insulating layer is formed over the probe substrate and patterned to expose the leads. Conductors, connected to the leads, are formed over the insulating layer and define a probing area of a least 250 cm$^2$. A process of forming an electronic device includes contacting a surface of a workpiece using conductors. Subset of the conductors are activated to determine four-point-probe parameters at different areas of the workpiece.

19 Claims, 10 Drawing Sheets

PROBE APPARATUS, A PROCESS OF FORMING A PROBE HEAD, AND A PROCESS OF FORMING AN ELECTRONIC DEVICE

BACKGROUND

1. Field of the Disclosure

This disclosure relates to a probe apparatus, a process of forming a probe head, and a process of forming an electronic device.

2. Description of the Related Art

Test probes are extensively used during the development of an integrated circuit (IC) fabrication process as well as during the manufacturing process of the IC components. One type of test probe, the four-point probe, is used to measure the electrical resistance of metal and semiconductor materials. Electrical resistance measurements often are performed at multiple sites on a workpiece. Testing is typically performed in a serial manner wherein the test probes, and four-point probes, in particular, are relocated to subsequent sites after completing measurements at a previous site. Moving the test probes is time-consuming and results in wear of the test probe conductors.

BRIEF DESCRIPTION OF THE DRAWINGS

The present disclosure may be better understood, and its numerous features and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION

A workpiece, such as an electronic device workpiece, can include conductive and non-conductive materials. At various points of time during a manufacturing process, or during the development of the manufacturing process, analysis of electrical properties of these materials can be performed using test probes. Test probes can be part of a probe head and can include conductors used to provide electrical contact with the workpiece and to conduct signals between the workpiece and test equipment, such as electronic instrumentation. A probe apparatus and process disclosed herein includes a set of conductors. These conductors can span a significant portion or substantially all of a surface of the workpiece. A subset of the conductors can be activated while another subset can be or remain deactivated. Thus, different probe geometries can be realized, and different probing events can be accomplished without separating and subsequent contacting of the conductors and the workpiece.

In an embodiment, an analysis of the electrical properties can be performed in order to determine a four-point-probe parameter of the material. This information can be used to determine a thickness of a layer of the material. The electrical properties and thickness of the material can indicate whether sufficient material formation or removal has occurred. For example, during the fabrication of electronic devices, conductive materials can be deposited or plated onto a surface of a substrate. Conversely, these materials can be etched or polished to remove a portion of the material from a portion of the workpiece. In a particular embodiment, the probe apparatus can be used to determine whether a process operation was performed successfully or if further action is needed or desired.

As used herein, the term "four-point-probe parameter" is intended to mean a value of a variable that can be obtained from a four-point probe measurement. An example of a four-point-probe parameter includes a bulk resistivity, a sheet resistance, another suitable parameter, or any combination thereof.

Attention is now directed to a probe apparatus used to probe the workpiece in order to provide electrical analysis of the workpiece material. The information herein is provided to aid in understanding particular details, and is not to limit the apparatus and process presently disclosed.

Figure 1:
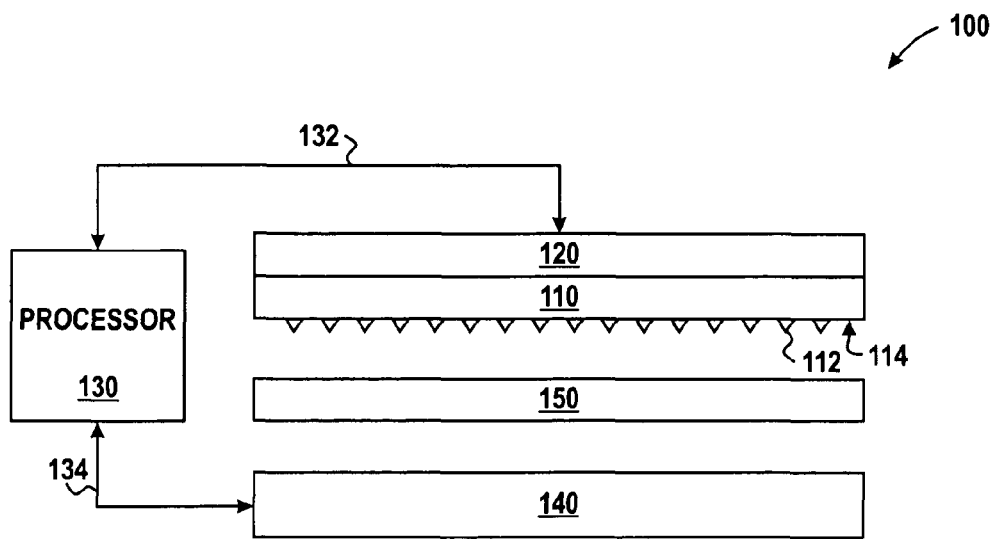
FIG. 1 includes an illustration of a probe apparatus.

FIG. 1 illustrates a probe apparatus 100 in accordance with an embodiment of the present disclosure. Probing apparatus 100 includes a probe head 110 and associated conductors 112 disposed adjacent to a surface 114 of probe head 110. Probing apparatus 100 also includes a probe head interface 120, a processor 130, and a mandrel 140. The probe apparatus can be used to probe a workpiece 150. Processor 130 can be electrically connected to probe head interface 120 via an interconnect 132, and to mandrel 140 via an interconnect 134. During operation, conductors 112 of probe head 110 and workpiece 150 are brought into electrical contact. Workpiece 150 can be physically supported by mandrel 140. Although not illustrated in FIG. 1, mechanical infrastructure can be used to support, align, clamp, or any combination thereof, the probe head assembly (probe head 110 and probe head interface 120), workpiece 150, and mandrel 140.

Electrical signals are transferred between processor 130 and conductors 112 via probe head interface 120 and interconnect 132 when probing. For example, processor 130 can provide an electric potential across two conductors and measure an electrical potential across another pair of conductors, similar to a four-point probe. In a particular embodiment, processor 130 can monitor the temperature of probe head 110. Processor 130 also can configure and monitor attributes of mandrel 140 via interconnect 134. For example, processor 130 can regulate the temperature of mandrel 140, thereby heating or cooling workpiece 150, or move mandrel 140, if needed or desired. The resistivity of a material can change predictably in response to a change in the temperature of the material. The temperature of workpiece 150 can be regulated, and measurements can be collected at discrete temperatures or during a thermal ramp so that a resistivity or a thickness of a workpiece material can be determined with increased accuracy as compared to the accuracy obtained using measurements performed at a single temperature. Processor 130 can include an information handling system, such as a computer, digital or analog instrumentation, another electronic device, or any combination thereof, to facilitate probing or other control of probe apparatus 100.

Figure 2:
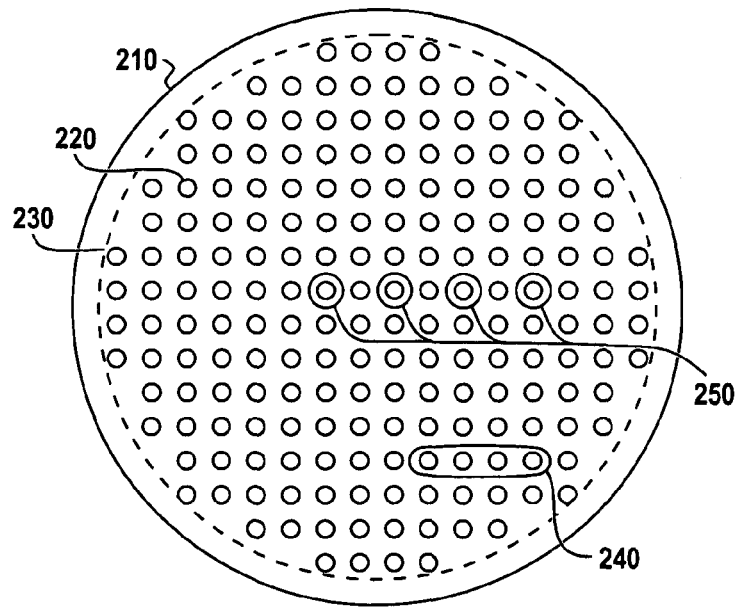
FIG. 2 includes an illustration of a probe head and associated conductors.

FIG. 2 illustrates the surface of a probe head 210, in accordance with an embodiment of the present disclosure. Probe head 210 is an example of a probe head such as probe head 110 in FIG. 1. A set of conductors 220 is disposed across the surface of probe head 210 and define a probe area 230. Also illustrated are two examples of conductor subsets: a subset 240 and a subset 250. While two conductor subsets are illustrated, after reading this specification, skilled artisans will understand that other conductor subsets can be provided. The configuration of a particular conductor subset can include a co-linear arrangement, as illustrated, or can be arranged in another geometric configuration, such as a square. Furthermore, while each of conductors 220 is illustrated as a "point," other conductor shapes are possible. For example, conductors 220 can be implemented as balls, bumps, or other suitable shapes. The number of conductors 220 included at probe head 210 can be partially determined by probe area 230, the size of each conductor, and spacing between each conductor. For example, probe head 210 can include hundreds or thousands of conductors 220.

During a probing operation, nearly any number of conductors 220 and subsets of conductors 220 can be activated, while the remaining conductors are or can be deactivated. For example, conductor subset 240 can be configured to implement a four-point probe, wherein the individual conductors 220 are spaced to define a particular pitch. Conductor subset 250 can be configured to implement a different four-point probe, wherein the individual conductors are spaced farther apart, thus, defining a different conductor pitch. Selecting a specific conductor pitch, commensurate with the thickness of the material being probed, can be advantageous. For example, a particular pitch of conductors, used to analyze thin materials, can be less than a different pitch of conductors used to analyze thicker materials. Different conductor subsets can be activated, and each may have its own specific pitch, geometric arrangement, orientation, or any combination thereof. After reading this specification, skilled artisans will be able to determine which subsets of conductors, and what subset configurations, address the needs of a particular application.

A portion or substantially all of conductors 220 of probe head 210 can be configured to contact a surface of workpiece 150 substantially simultaneously. Conductors 220 can remain in contact with workpiece 150 during and between activating different subsets of conductors 220. Probing using each subset can be performed in a parallel or a serial manner at different, localized or disparate areas of workpiece 150. Probe area 230 can cover most or substantially all of the workpiece to be probed, such as 250 cm$^2$, 1100 cm$^2$, or greater. For example, probe head 210 can be used to probe substantially all of a nominal 150, 200, or 300 millimeter diameter integrated circuit wafer, or larger substrates such as those used in flat-panel displays having a diagonal dimension of over one meter. Probing can be used in a manufacturing process of a workpiece to determine the properties of conductive and insulating layers of material. For example, the thickness of a suitably thin conductive layer of material can be determined by measuring the value of a four-point-probe parameter, specifically a sheet resistance, using a subset of conductors 220 configured as a four-point probe. The thickness of a conductive layer of material can be calculated by dividing a bulk resistivity of the material by a measured sheet resistance. Alternatively, a lack of a conductive layer, or a discontinuity within a conductive layer, may also be determined using a four-point probe.

As previously described, a subset of conductors 220 can be configured to implement a four-point probe. A four-point probe uses four conductors to contact the surface of a workpiece, such as workpiece 150. The four conductors typically can be arranged in a co-linear configuration. During operation of the four-point probe, a voltage potential is applied across the outer two conductors, which results in a current flowing from the first of these conductors, through the workpiece material, and to the second conductor. The inner two conductors also contact the surface of the workpiece, and a voltage can be measured across these conductors. This voltage potential across these conductors results from the current passing through an electrically resistive portion of the material. Depending on the thickness of the material, this resistance can correspond to a bulk resistivity or a sheet resistance of the material. Because the bulk resistivity of the material is typically known, a four-point probe is generally used to measure the sheet resistance of relatively thin layers of material. Measuring bulk resistivity of a material can also be useful. For example, probing can be used to determine if a copper material is contaminated with oxygen, such as resulting from a leak in a vacuum chamber, wherein the contamination alters the bulk resistivity of the copper. Probing also can be used to identify film impurities or undesirable grain orientations present in a film.

Probing a workpiece surface that includes patterned materials can provide different measured values depending on the portion of the workpiece surface contacted by the conductors. Therefore, probing a number of areas of the surface and statistically evaluating measured values from this population sample can be advantageous when using probing to monitor the state of a process. The techniques used to interpret these measured values can depend on a variety of factors. The success or completion of a process may be characterized by measured values that entirely or predominantly exceed, or fall short of, a particular threshold. Alternatively, the successful completion of a process may be characterized by measured values that exhibit a bi-modal distribution, wherein measured values disparate from two expected ranges of values can indicate a failed or incomplete process. In yet other circumstances, the success of a process may be characterized by a specific range or distribution of measured values that match a pattern determined by experience. In each of the described techniques, the characterization and analysis techniques used may be valid and pertain to a family of devices, or they may be applicable to only a particular device. The technique may be unique for material at a specific step in a fabrication process. For example, the technique may be uniquely applicable to different metal layers or metal levels of an integrated circuit.

An individual conductor of conductors 220 can become worn or defective as a result of cumulative use. A validation or calibration technique can be used to identify a worn or defective conductor, and the conductor can be subsequently not included in a particular conductor subset. For example, a validation or calibration technique can include acquiring measurements using a particular subset of conductors, rotating the workpiece a number of degrees, acquiring another measurement at the same location on the workpiece using a different conductor subset, and comparing the two measurements.

Attention is now directed to a process of forming probe head 210 in accordance with an embodiment of the present disclosure. This process can be used to provide a probe head with mechanically compliant probe conductors allowing the conductors to be overdriven after first contacting the surface of a workpiece. This process can be better understood with reference to FIGS. 3-9.

Figure 3:
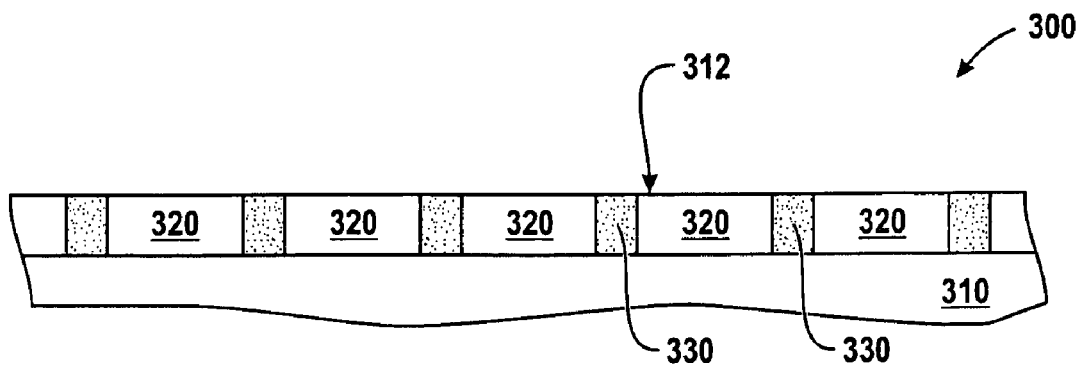
FIG. 3 includes an illustration of a cross sectional view of a portion of a partially completed probe head including a probe substrate and conductive leads.

FIG. 3 illustrates a cross sectional view of a portion of a partially completed probe head 300. Probe head 300 includes a probe substrate 310 and an insulating matrix 320 surrounding conductive leads 330. Primary surface 312 can be a substantially flat surface upon which the subsequent probe head components are formed. Probe substrate 310 can include silicon, ceramic, silica-filled resin, organic resin, or any material possessing the structural attributes and durability suited to withstand forces associated with probing. Although not illustrated in FIG. 3, probe substrate 310 may include an interconnect level that conducts electrical signals between conductive leads 330 and probe head interface 120 in FIG. 1. Conductive leads 330 can be configured in two dimensions with a uniform or non-uniform pitch along primary surface 312. Conductive leads 330 can include copper, gold, another suitable conductive material, or any combination thereof. Each of conductive leads 330 is electrically insulated from adjacent leads by insulating matrix 320.

Figure 4:
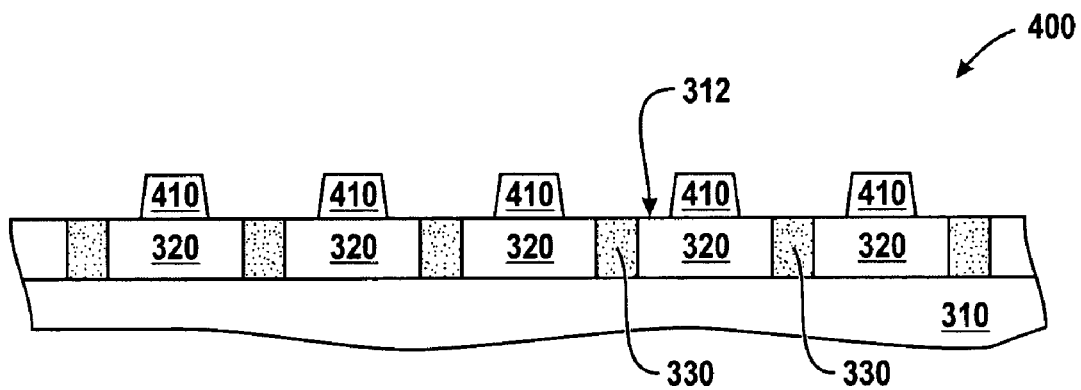
FIG. 4 includes an illustration of a cross sectional view of a portion of the probe head of FIG. 3 after forming sacrificial members.

FIG. 4 illustrates a cross sectional view of a portion of a partially completed probe head 400 after forming sacrificial members 410. Sacrificial members 410 can be subsequently removed to define air-gap voids, which facilitate elastic compliance of subsequently formed probe head conductors. Sacrificial members 410 are formed upon primary surface 312, and each sacrificial member 410 is adjacent to a corresponding conductive lead 330. Sacrificial members 410 can be formed by first forming a layer of sacrificial material over substantially the entire surface of substrate 310, and patterning the layer to define sacrificial members. The patterning can be accomplished via conventional or proprietary photolithographic and etching techniques. Sacrificial members 410 can include a material that can be subsequently removed by a chemical, thermal, or other process. The removal process can be selective and preferentially removes the sacrificial material without substantially altering other materials and components of the probe head, including remaining portions of layers formed between the times of forming the layer of sacrificial material and subsequent removal of sacrificial members 410. An example of a sacrificial material can be a polymer, such as polynorborene, polyethylene, polypropylene, polystyrene, another polymer, or any combination thereof.

Figure 5:
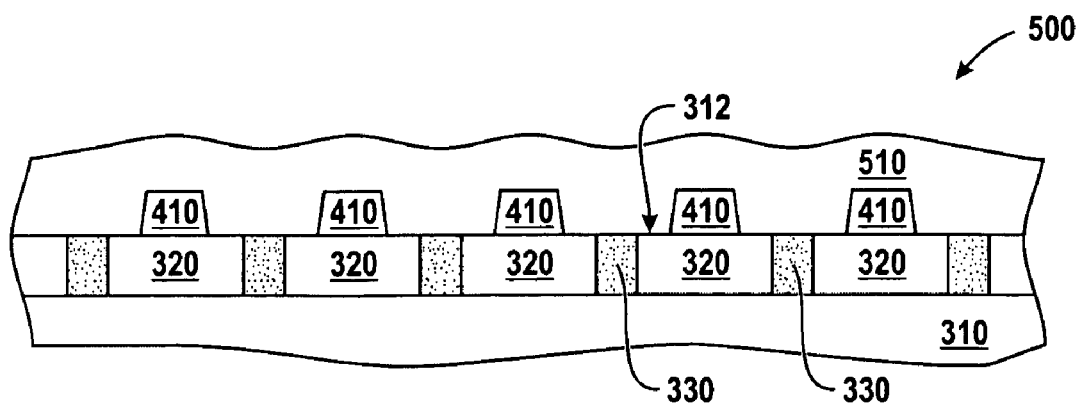
FIG. 5 includes an illustration of a cross sectional view of a portion of the probe head of FIG. 4 after forming an insulating layer.

FIG. 5 illustrates a cross sectional view of a portion of a partially completed probe head 500 after forming an insulating layer 510. Insulating layer 510 can be a flexible material that, in combination with the previously defined air-gap voids, provide the before-mentioned conductor compliance. Insulating layer 510 can be formed over substantially the entire surface of substrate 310, including over sacrificial members 410. Insulating layer 510 can be a polymer, a synthetic rubber, another flexible material, or any combination thereof that will yield elastically in response to a force and substantially return to its original shape when the force is removed.

Figure 6:
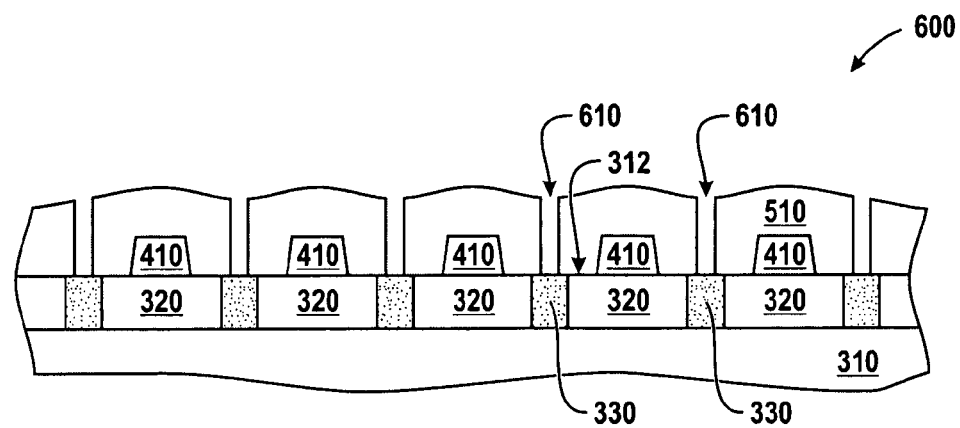
FIG. 6 includes an illustration of a cross sectional view of a portion of the probe head of FIG. 5 after patterning the insulating layer.

FIG. 6 illustrates a cross sectional view of a portion of a partially completed probe head 600 after insulating layer 510 is patterned to provide openings above conductive leads 330, and to expose a portion of each of sacrificial members 410. The openings above conductive leads 330 allow electrical connections to be made to each of conductive leads 330. Portions of sacrificial members 410 are exposed to allow each sacrificial member to subsequently be removed. Insulating layer 510 can be patterned by conventional or proprietary photolithographic and etching techniques that selectively remove portions of insulating layer 510.

Figure 7:
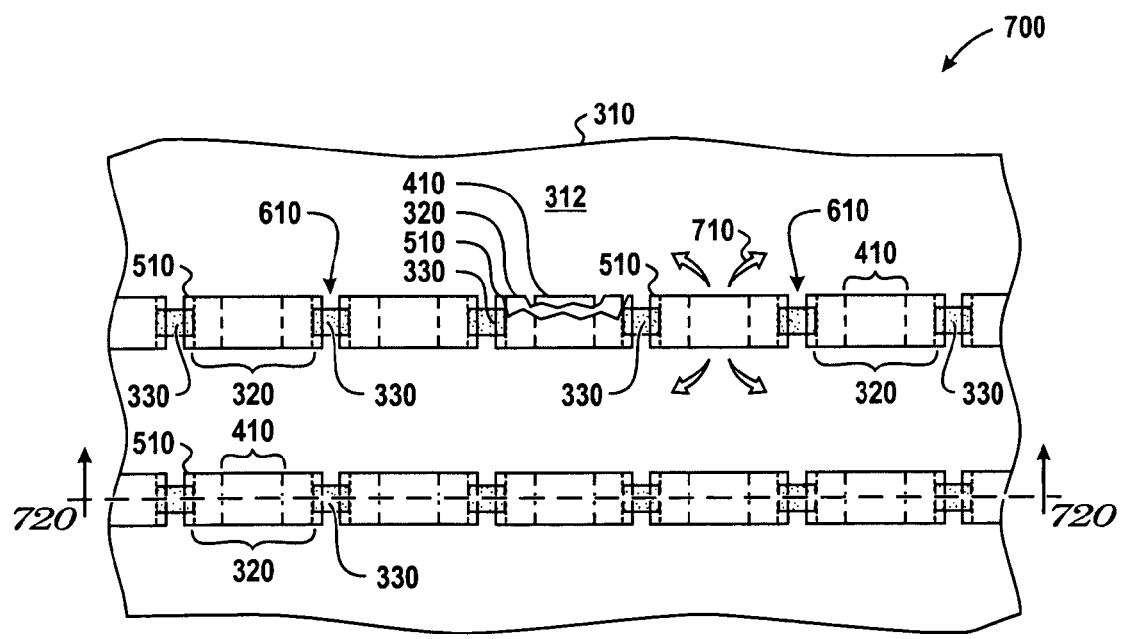
FIG. 7 includes an illustration of a top view of a portion of the probe head of FIG. 6 after removing the sacrificial members.

FIG. 7 illustrates a top view of primary surface 312 of a portion of a partially completed probe head 700 wherein sacrificial members 410 are removed to define air-gap voids. After insulating layer 510 is patterned, as described with reference to FIG. 6, the remaining portions of insulating layer 510 are illustrated as rectangular structures overlaying sacrificial members 410, overlapping sacrificial members 410 in one direction, and coincident with the edges of sacrificial members 410 in another direction. Also illustrated are conductive leads 330, which are substantially exposed when insulating layer 510 is patterned. Because the portions of sacrificial members 410 are exposed, the sacrificial members can be removed via conventional or proprietary thermal techniques, etching techniques, or any combination thereof, as indicated by arrows 710. Removing sacrificial members 410 defines air-gap voids under insulating layer 510 where sacrificial members were previously located. Cross section 720 corresponds to the cross sectional view of FIG. 6 after sacrificial members have been removed.

Figure 8:
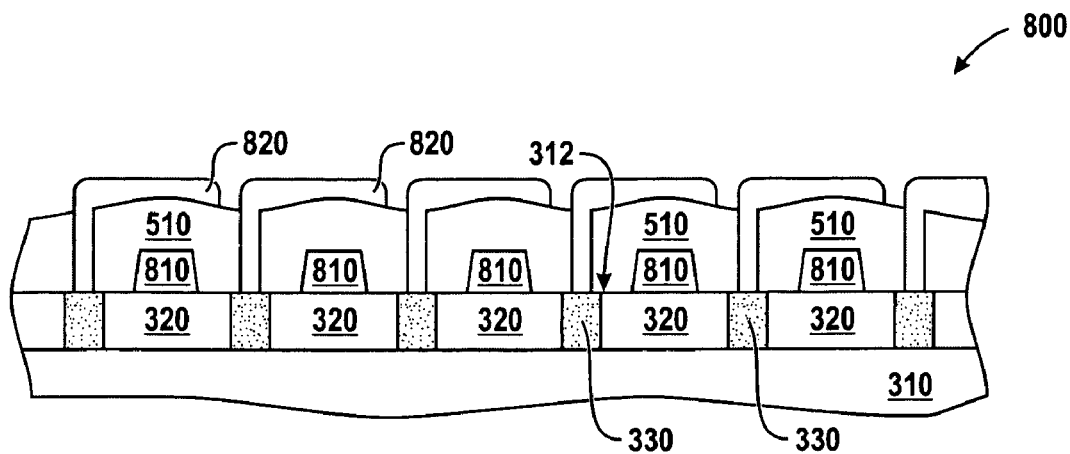
FIG. 8 includes an illustration of a cross sectional view of a portion of the probe substrate of FIG. 7 after forming conductive straps.

FIG. 8 illustrates a cross sectional view of a portion of a partially completed probe head 800 after straps 820 are formed to provide a conductive path extending from conductive leads 330, up and onto the surface of insulating layer 510, and overlying air gap void 810. Straps 820 conduct signals between the probe head conductors, formed in the next procedure, and conductive leads 330. Each of straps 820 can be electrically isolated from other straps. Straps 820 can include copper, gold, a conductive polymer, another conductive material, or any combination thereof, that is flexible, durable, and capable of withstanding repetitive strain and bending associated with probing.

Figure 9:
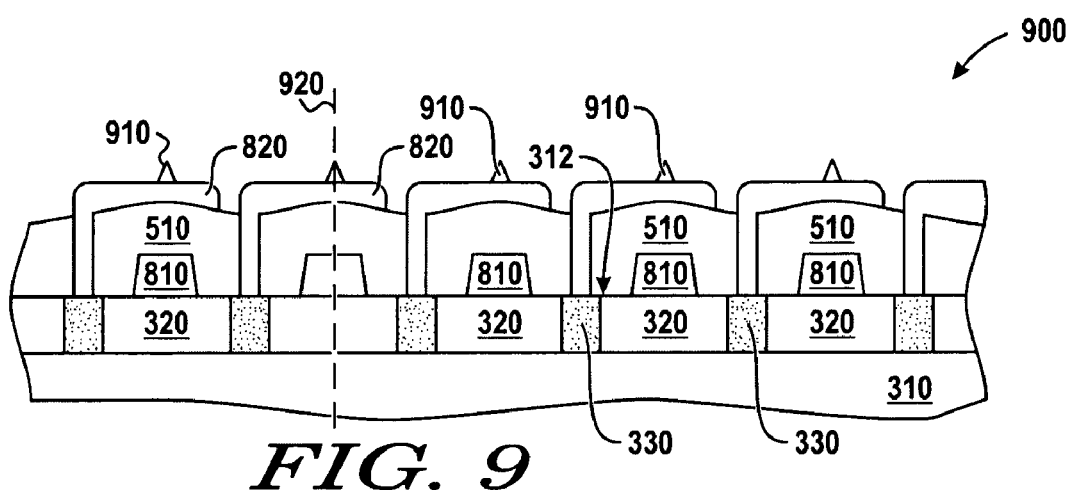
FIG. 9 includes an illustration of a cross sectional view of a portion of the probe head of FIG. 8 after forming conductors over the insulating layer.

FIG. 9 illustrates a cross sectional view of a portion of a substantially complete probe head 900, such as probe head 110, after conductors 910 are formed. Conductors 910 can be used to provide electrical contact with a material that is being probed. Conductors 910 can correspond to conductors 112 in FIG. 1 or conductors 220 in FIG. 2. Each of conductors 910 can be formed on a corresponding strap 820 that overlies insulating layer 510. Each of conductors 910 is located so that a corresponding air-gap void 810 is located along a line substantially perpendicular to primary surface 312, and between probe substrate 310 and the corresponding conductor 910. The resulting structure provides a compliant foundation for conductors 910 such that when a force is applied to conductors 910, the insulating layer can deflect from its original shape, and to return to substantially the original shape when the force is removed. Straps 820 provide a conductive path between each of conductors 910 and a corresponding conductive lead 330.

The process described and depicted in FIGS. 3-9 represents an illustrative non-limiting embodiment of the present disclosure. After reading this specification, skilled artisans will understand that other techniques and materials can be used in or to construct probe head 110. For example, sacrificial members 410 can be replaced with a suitably flexible material that need not be removed, and yet allows straps 820 to flex and thus facilitates compliant conductors.

Figure 10:
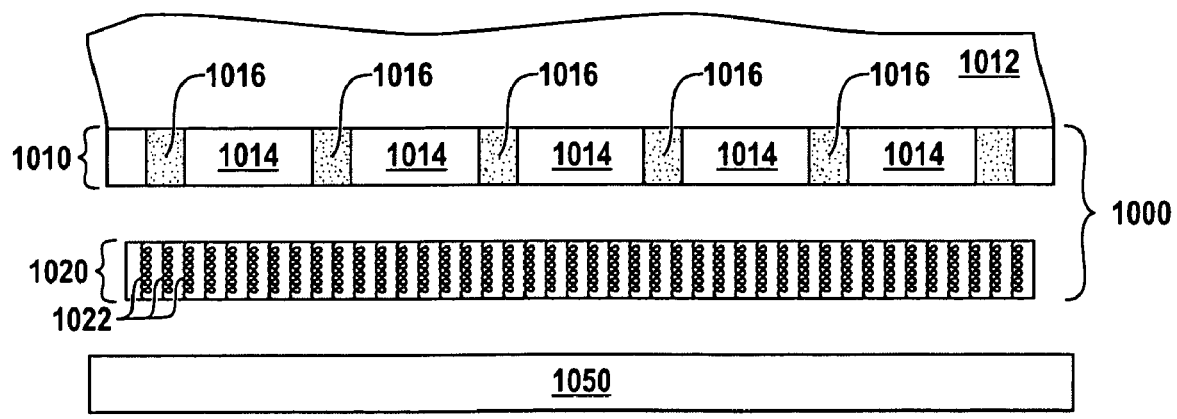
FIG. 10 includes an illustration of a cross sectional view of a portion of an alternative probe head using an interposer with z-axis conductors.

FIG. 10 illustrates a cross sectional view of a portion of another probe head 1000 in accordance with another embodiment of the present disclosure. Probe head 1000 uses an alternative method of providing the conductors that contact a surface of a workpiece during probing. Probe head 1000 can include a component 1010 that is substantially similar to the partially completed probe head 300 illustrated in FIG. 3, and an interposer 1020. Component 1010 includes probe substrate 1012, insulating matrix 1014, and conductive leads 1016. Interposer 1020 includes a set of conductors 1022 disposed within an interposer substrate. In a particular embodiment, the interposer substrate can include a moderately compressible and substantially non-conductive material. Also illustrated is workpiece 1050, the surface of which can be probed using probe head 1000.

Conductors 1022 can be configured uniformly or non-uniformly in two dimensions throughout the substrate of interposer 1020. Each of conductors 1022 can be electrically isolated from all other conductors. Each conductor can extend from one major surface to the opposite major surface, and each is electrically exposed on each major surface. For example, each of conductors 1022 can include z-axis conductors and can be configured as spring-like structures or can be implemented as spaced apart ball-shaped conductors. The latter configuration provides a substantially low resistance path between adjacent portions of the two major surfaces when interposer 1020 is compressed in the z-axis, as compared to the lateral directions (e.g., x-axis and y-axis).

During a probing operation, probe head 1000, including component 1010 and interposer 1020, and workpiece 1050, are brought together under suitable compressive force such that conductors 1022 of interposer 1020 contact and electrically connect regions of the surface of workpiece 1050 with conductive leads 1016 of component 1010. A subset of conductive leads 1016 can be activated, configured to act as a four-point probe, and determine a four-point-probe parameter of workpiece 1050. The surface of workpiece 1050 and the conductors 1022 of probe head 1000 can be configured to remain in contact during and between activating a particular subset of conductive leads 1016 and activating another subset of conductive leads 1016.

Attention is now directed to a process of forming an electronic device, such as workpiece 150, wherein probe head 110 can be used to facilitate the analysis of conductive and insulating layers in accordance with an embodiment of the present disclosure. This process can be better understood with reference to FIGS. 11-21.

Figure 11:
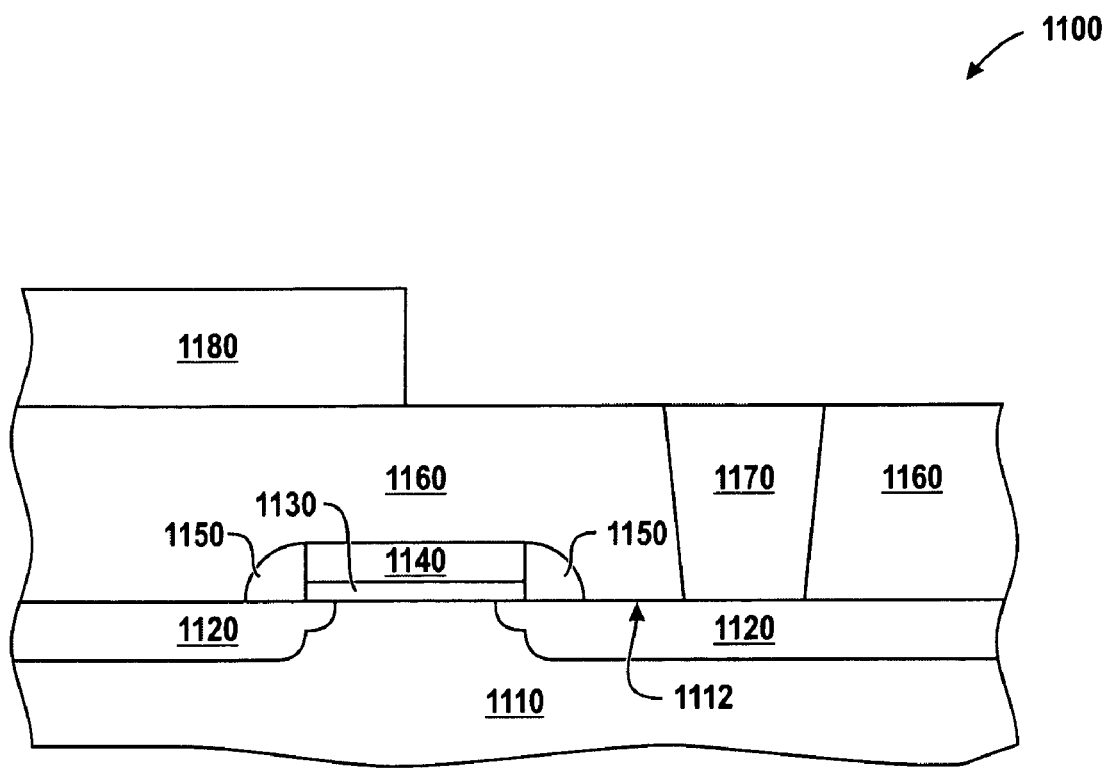
FIG. 11 includes an illustration of a cross sectional view of a portion of a workpiece including a transistor structure, patterned insulating layer with incorporated source/drain plug, and after patterning a second insulating layer.

FIG. 11 illustrates a cross sectional view of a portion of a workpiece 1100 that includes a substrate 1110. The substrate 1110 can include a monocrystalline semiconductor wafer, a semiconductor-on-insulator wafer, or other substrate used to form electronic devices. The substrate 1110 has a primary surface 1112.

Workpiece 1100 further includes a gate dielectric layer 1130 and a gate electrode 1140, wherein gate dielectric layer 1130 is disposed between primary surface 1112 of substrate 1110 and gate electrode 1140. Sidewall spacers 1150 are adjacent to the sides of gate electrode 1140 and gate dielectric layer 1130. Source/drain ("S/D") regions 1120 lie within the substrate, and from a top view, are adjacent to gate electrode 1140 and gate dielectric layer 1130. The transistor structure in the embodiment as illustrated in FIG. 11 may be operated as a transistor or as a capacitor. Although not illustrated, another electronic component or circuit (e.g., a transistor, a capacitors, resistor, a diode, another suitable electronic component, or any combination thereof) may also be part of workpiece 1100.

A patterned insulating layer 1160 overlies substrate 1110 and defines an opening 1170 to S/D region 1120. Although not illustrated, patterned insulating layer 1160 can further define other openings to S/D region 1120, gate electrode 1140, another component or circuit, or any combination thereof. Conductive plugs are formed within openings 1170 to allow subsequently-formed interconnects to be coupled to the underlying components.

Another patterned insulating layer 1180 overlies patterned insulating layer 1160 and defines an opening where subsequently-formed interconnects are to be formed. Although not illustrated, the patterning insulating layer 1180 can further define other openings for interconnects. In a particular embodiment, the opening can be referred to as an interconnect trench.

All of the features described with respect to FIG. 1100 can include conventional or proprietary material, include one or more films with each feature, and can be formed using conventional or proprietary deposition, growth, etch, implantation, other doping, polishing, or other suitable techniques.

Figure 12:
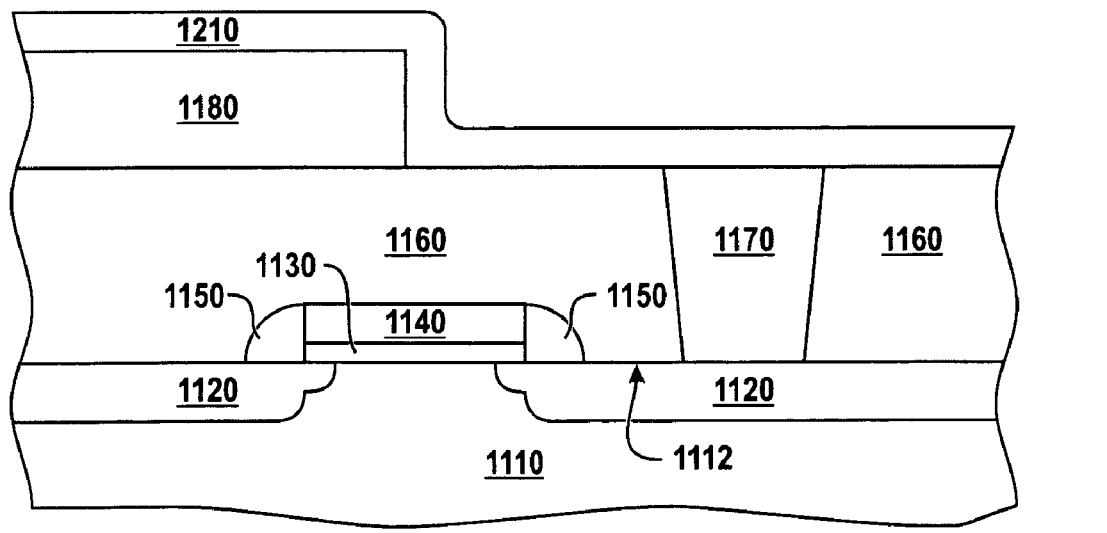
FIG. 12 includes an illustration of a cross sectional view of the workpiece of FIG. 11 after forming a conductive layer.

FIG. 12 illustrates a cross sectional view of a portion of a workpiece 1200 after forming a conductive layer 1210 over patterning insulating layer 1160 and 1180, and within opening 1170. Conductive layer 1210 can include an adhesion film, a barrier film, a seed layer or any combination thereof. The adhesion film can be used to promote adhesion between patterned insulating layer 1160, 1180, or both, and a subsequently-formed metal-containing film or layer (e.g., a metal nitride, Cu, or the like). The barrier film can have a composition and thickness sufficient to keep a material from a subsequently-formed metal-containing film from migrating into the patterned insulating layer 1160, 1180, or both. A seed film can promote electroplating a conductive material onto workpiece 1200. The seed film typically includes the same material that will be subsequently electroplated. For example, if copper is to be electroplated, the seed film can include copper. In another embodiment, the seed film can have a composition dissimilar to the material that will subsequently be electroplated. Conductive layer 1210 is relatively thin as compared to a subsequently-formed conductive material, and therefore, the conductive layer does not completely fill the opening within patterned insulating layer 1180. Conductive layer 1210 can have a thickness in a range of approximately 2 nm to approximately 50 nm. Conductive layer 1210 can be formed by using a conventional or proprietary deposition technique.

Figure 13:
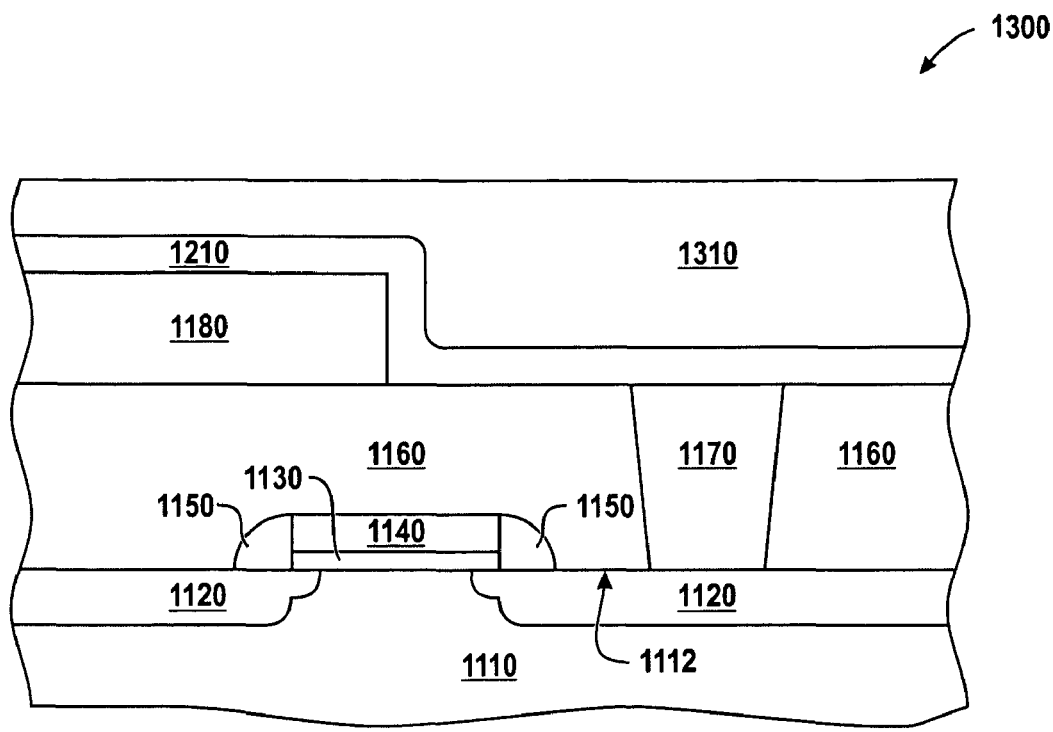
FIG. 13 includes an illustration of a cross sectional view of the workpiece of FIG. 12 after forming another conductive layer.

FIG. 13 illustrates a cross sectional view of a portion of a workpiece 1300 after forming a conductive layer 1310 over conductive layer 1210. After a subsequent etching or polishing procedure, conductive layer 1310 ultimately provides a first level interconnect to conduct signals. Conductive layer 1310 can have a bulk resistivity that is significantly lower than the bulk resistivity of the conductive layer 1210 or a particular film within conductive layer 1210. Conductive layer 1310 can include copper, gold, silver, aluminum, another suitable conductive material, or any combination thereof. Conductive layer 1310 can be formed using a conventional or proprietary deposition technique. In a particular embodiment, the conductive layer 1310 is copper and is formed using a plating technique.

Figure 14:
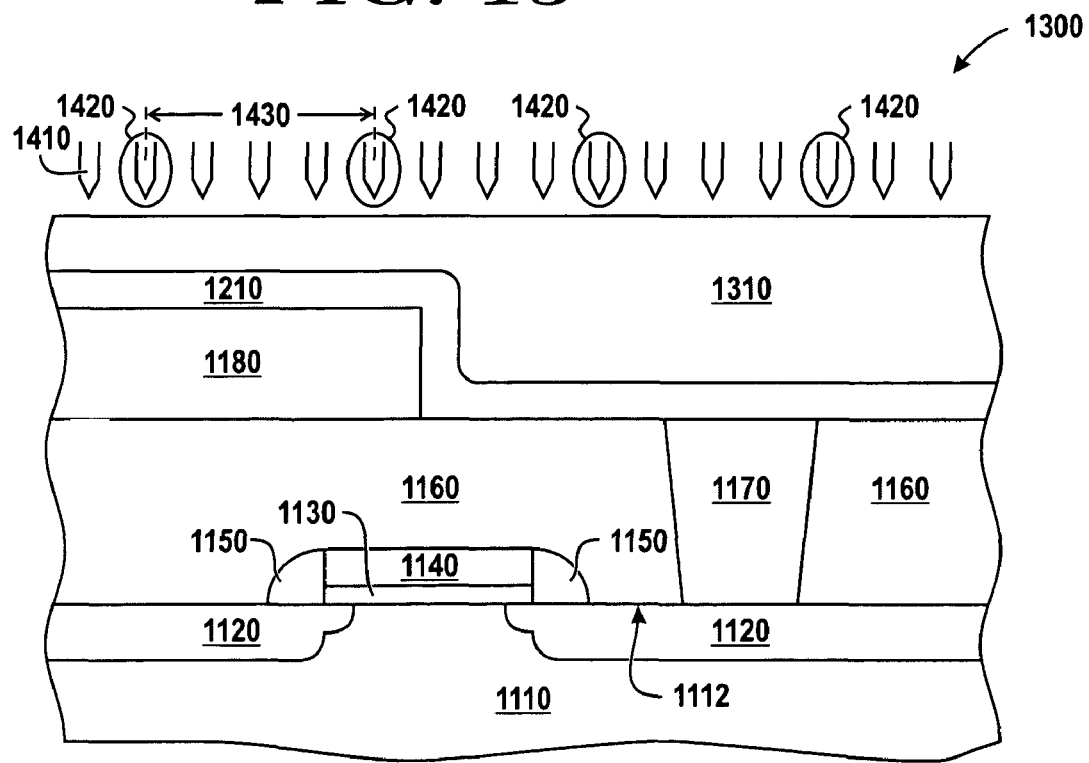
FIG. 14 includes an illustration of a cross sectional view of the workpiece of FIG. 13 wherein conductors are used to contact a surface of the workpiece.

FIG. 14 illustrates a cross sectional view of a portion of workpiece 1300 including conductors 1410 (such as conductors 112 of probe head 110 in FIG. 1, conductors 220 of probe head 210 in FIG. 2, conductors 910 of probe head 900 in FIG. 9, or conductors 1022 of interposer 1020 in FIG. 10). Conductors 1410 can be used to probe conductive layer 1310 to determine if material has been deposited to a sufficient thickness. Conductors 1410 and the surface of conductive layer 1310 of workpiece 1300 are brought into contact and subsequent overdrive can be provided. Overdriving conductors 1410 after a portion of the conductors first make contact with the surface of the workpiece can be advantageous to compensate for non-uniformity in conductor length. Workpiece 1300 and conductors 1410 can be brought into contact by advancing conductors 1410 towards workpiece 1300, advancing workpiece 1300 towards conductors 1410, or both.

A subset 1420 of conductors 1410 is activated and configured as a four-point probe to enable the acquisition of measurements to determine a four-point-probe parameter of conductor 1310. Conductors 1410 that are not included in conductor subset 1420 can be included in other conductor subsets, the other conductor subsets being active or inactive. Conductors 1410 can remain in contact with workpiece 1300 during and between activating different subsets of conductors 1410. Each subset of conductors 1410 can be configured as a four-point probe and can be used to determine a four-point-probe parameter at the exposed surface of the workpiece. For this example, the four-point-probe parameter is a sheet resistance of the material that is being probed. The measured sheet resistance, in conjunction with the known bulk resistivity of the material comprising conductor 1310, can be used to determine the thickness of conductive layer 1310. A pitch between the individual conductors of subset 1420 is illustrated by a distance 1430. For the purpose of this example, this measurement may indicate that the thickness of conductive layer 1310 is too thin and should be thickened.

Figure 15:
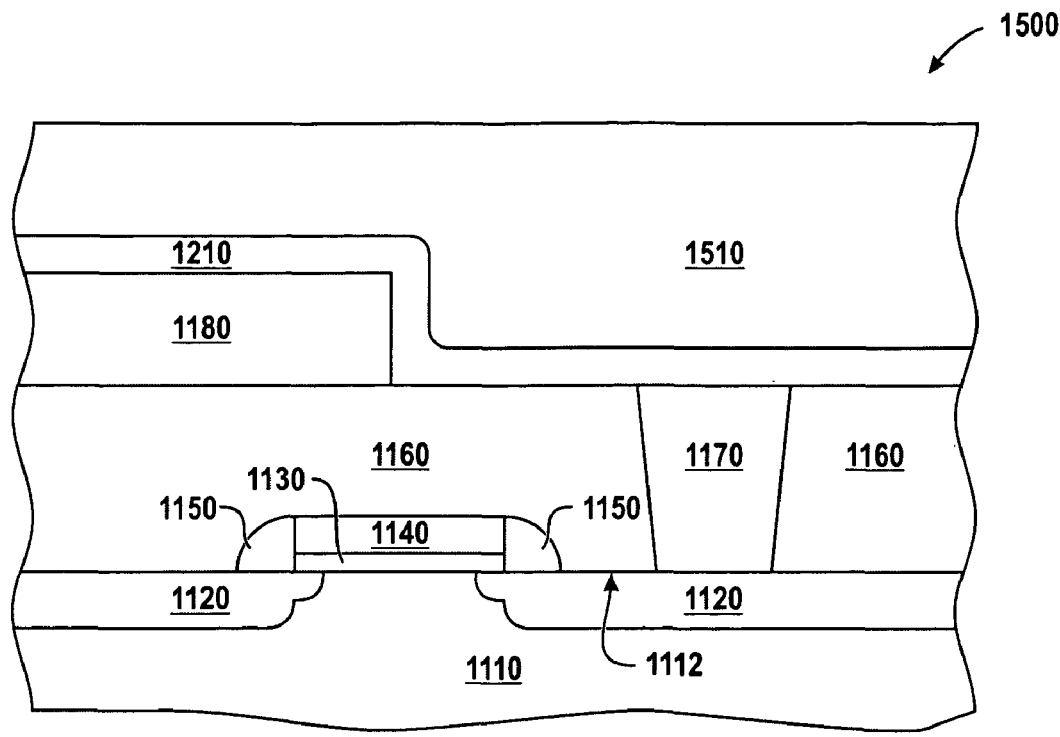
FIG. 15 includes an illustration of a cross sectional view of the workpiece of FIG. 13 after thickening the conductive layer.

FIG. 15 illustrates a cross sectional view of a portion of a workpiece 1500 after additional conductive material has been formed over conductive layer 1310 of FIG. 14 to provide a thicker conductive layer 1510.

Figure 16:
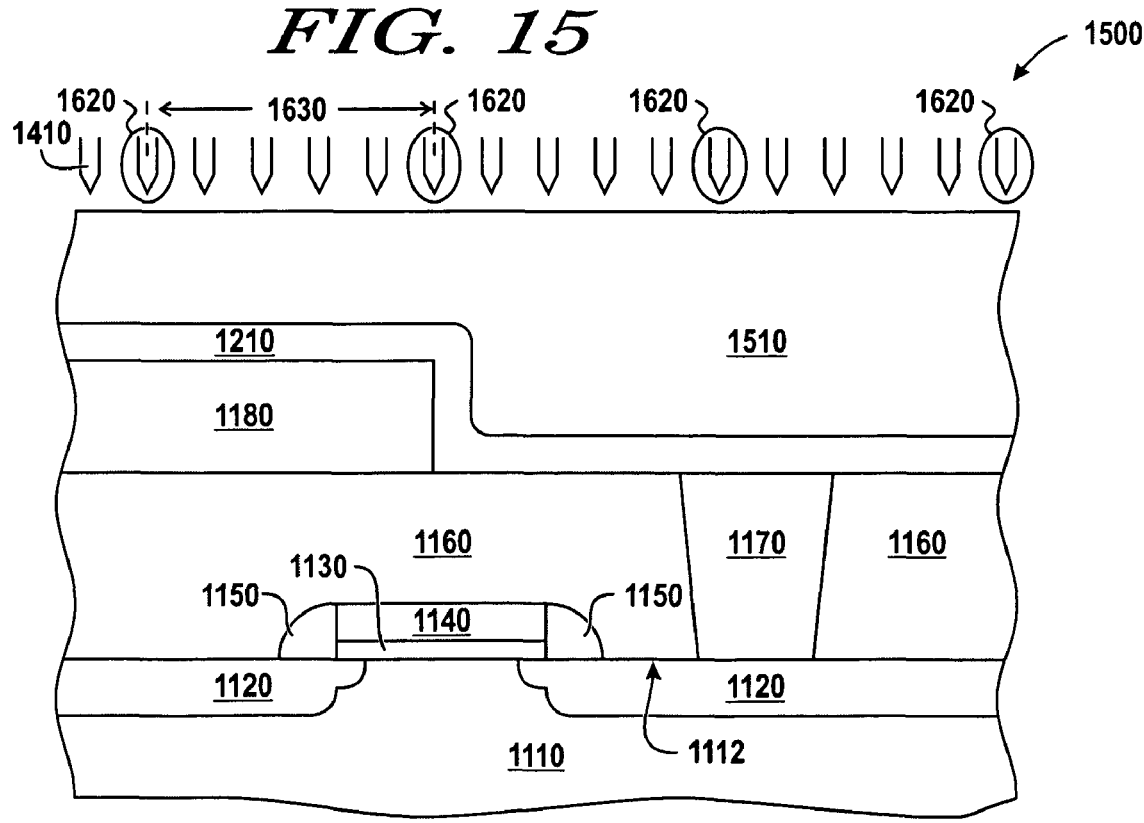
FIG. 16 includes an illustration of a cross sectional view of the workpiece of FIG. 15 wherein conductors are used to contact the surface of the workpiece after thickening the conductive layer.

FIG. 16 illustrates a cross sectional view of a portion of workpiece 1500 including conductors 1410. Conductors 1410 and the surface of conductive layer 1510 are brought into contact to measure the sheet resistance of the thickened conductive layer 1510. A different subset 1620 of conductors 1410 may be activated, the effective pitch of the conductors comprising subset 1620 having a pitch, illustrated by a distance 1630, that is greater than the pitch illustrated by distance 1430 of subset 1420 in FIG. 14. As used herein, effective pitch refers to the spacing between immediately adjacent activated conductors. The greater pitch can be used to perform analysis because the thickness of conductive layer 1510 is greater than the thickness of layer 1310 in FIG. 14. For the purpose of this example, this measurement may indicate that the thickness of conductive layer 1510 is sufficiently thick at this stage in the process.

Figure 17:
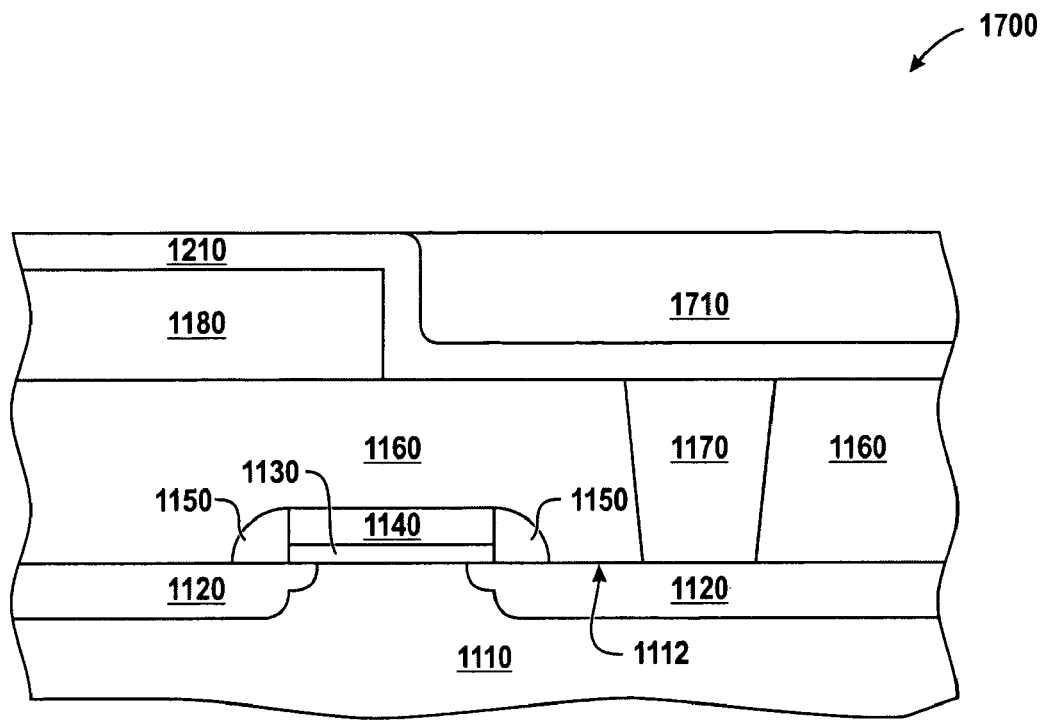
FIG. 17 includes an illustration of a cross sectional view of the workpiece of FIG. 15 after removing a portion of the conductive layer.

FIG. 17 illustrates a cross sectional view of a portion of a workpiece 1700 after a portion of conductive layer 1510 in FIG. 16 has been removed, resulting in conductive layer 1710. The removal of material can be performed by chemical-mechanical polishing, etching, another suitable technique, or any combination thereof. Although the removal operation is intended to remove substantially all of the conductive layers 1210 and 1710 over insulating layer 1180, some of either or both conductive layers 1210 and 1710 may not be removed. In an embodiment, the remaining portion of either or both conductive layers 1210 and 1710 may be sufficiently thin over insulating layer 1180 that a visual inspection (e.g., using an optical microscope) does not detect such remaining portion, even though such a remaining portion may act as a leakage path or an electrical short circuit. In a particular embodiment, the conductive layer 1210 can include a barrier film that includes a metal nitride. Nitride compounds can be more difficult to remove using a polishing technique.

Figure 18:
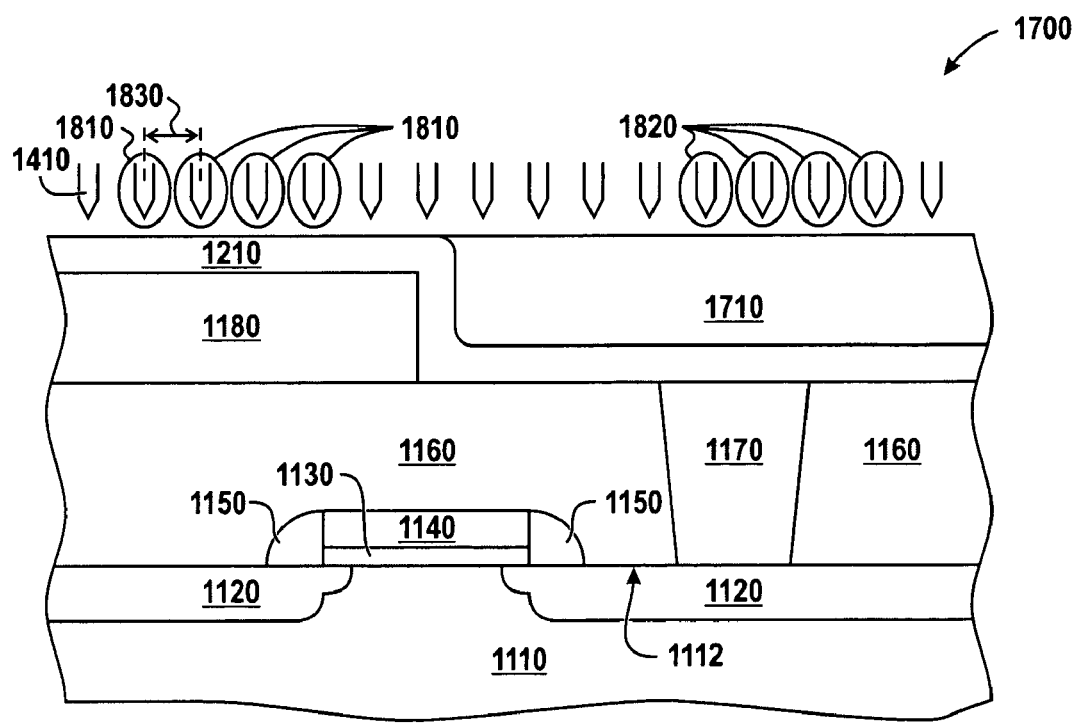
FIG. 18 includes an illustration of a cross sectional view of the workpiece of FIG. 17 wherein conductors are used to contact the surface of the workpiece after removing the portion of the conductive layer.

FIG. 18 illustrates a cross sectional view of a portion of workpiece 1700 including conductors 1410. Conductors 1410 and conductive layers 1210 and 1710 are brought into contact and subsequent overdrive can be provided. Different conductor subsets, 1810 and 1820, of conductors 1410 are activated. The effective pitch of the conductors comprising conductor subsets 1810 and 1820 have a smaller pitch, illustrated by distance 1830, than distance 1430 of subset 1420 in FIG. 14. The smaller effective pitch can be used to perform the measurement because the thickness of conductive layer 1710 is thinner than the thickness of layer 1510 in FIG. 16. The removal operation illustrated in FIG. 17 is performed to remove substantially all of conductors 1710 and 1210 that is over insulating layer 1180. A measurement provided by conductor subset 1820 is expected to indicate that conductive layer 1710 in this area is still relatively thick, as indicated by a substantially low sheet resistance. If a sufficient portion of layers 1210 and 1710 has been removed, a sheet resistance measured by conductor subset 1810 should be nearly infinite. If a portion of layer 1210 or 1710 remains over insulating layer 1180, the sheet resistance measured by conductor subset 1810 may be too low. For example, if a sufficient portion of layer 1210 has been removed, the measured sheet resistance can be in excess of one million ohms per square or can be beyond the ability to calculate accurately. A measured sheet resistance of less than one hundred thousand ohms per square can indicate that a sufficient portion of layer 1210 has not been removed from over insulating layer 1180. A particular value of sheet resistance that indicates that sufficient material has or has not been removed can depend on details specific to a particular operation. For the purpose of this example, a measurement performed using conductor subset 1810 may indicate that some portion of conductive layers 1710 and 1210 remain over insulating layer 1180. Therefore, further polishing of conductive layers 1710 and 1210 will be performed.

Figure 19:
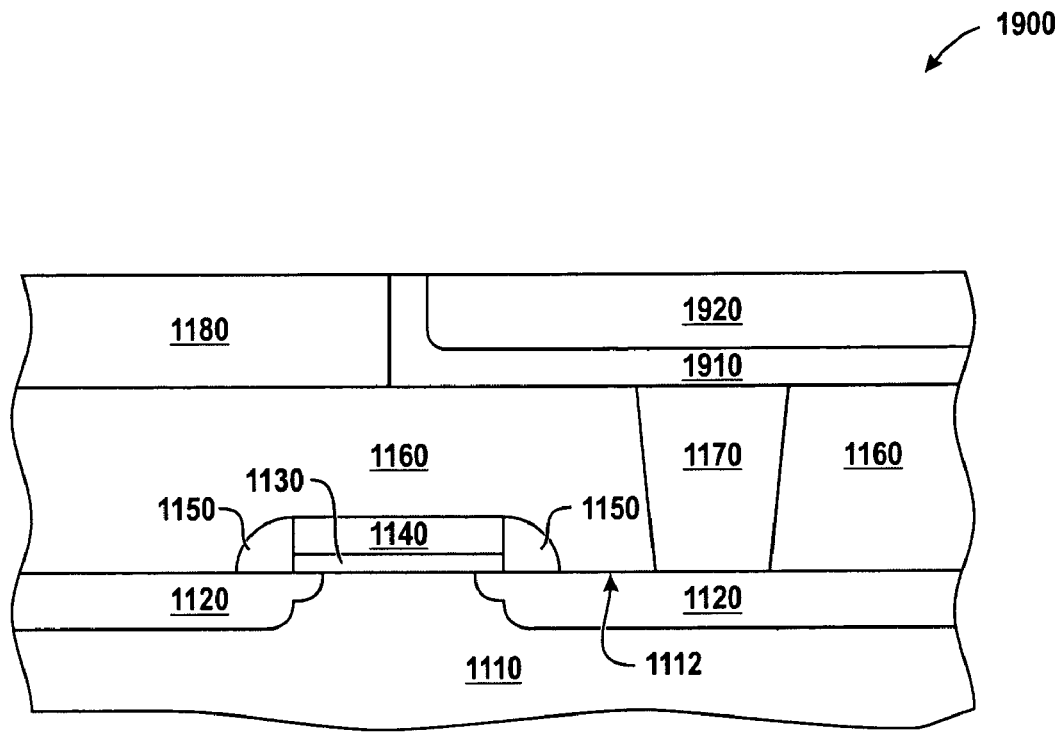
FIG. 19 includes an illustration of a cross sectional view of the workpiece of FIG. 17 after removing an additional portion of the conductive layer.

FIG. 19 illustrates a cross sectional view of a portion of a workpiece 1900 after further removal of conductive layer 1710 and 1210 of FIG. 18, resulting in conductive layers 1910 and 1920.

Figure 20:
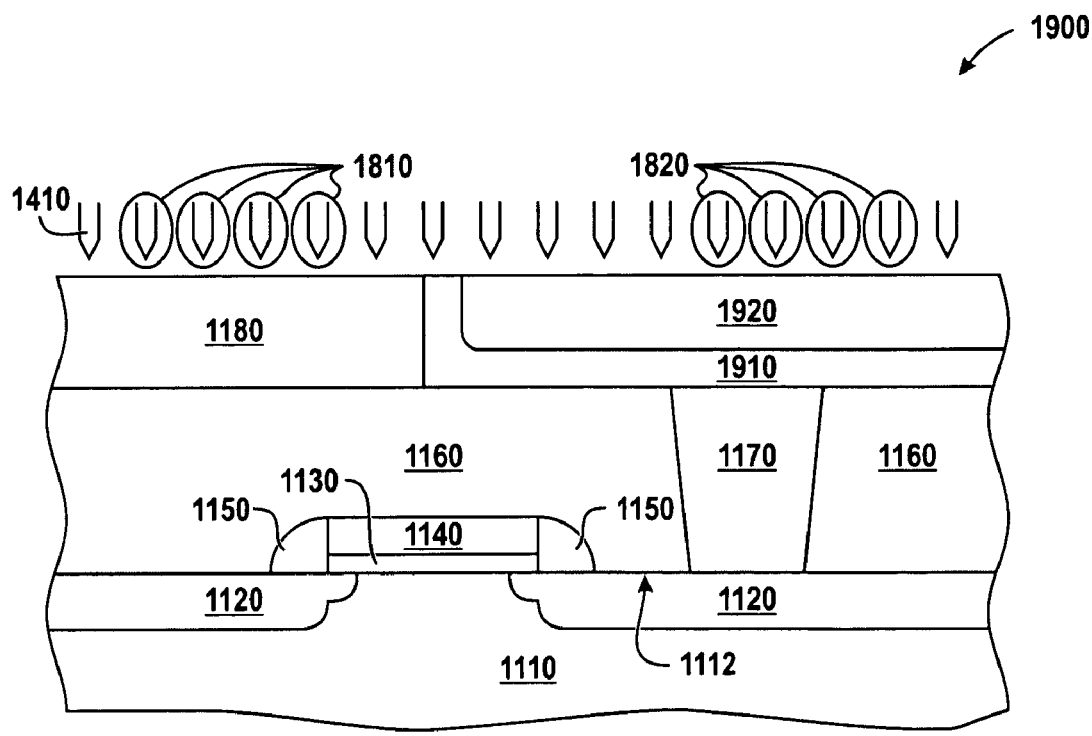
FIG. 20 includes an illustration of a cross sectional view of the workpiece of FIG. 19 wherein conductors are used to contact the surface of the workpiece after removing the additional portion of the conductive layer.

FIG. 20 illustrates a cross sectional view of a portion of workpiece 1900 including conductors 1410. Conductors 1410 and the surface of conductive layers 1910 and 1920 are brought into contact. Conductor subsets 1810 and 1820 are activated and analysis of the material at the local areas corresponding to each subset is performed. For the purpose of this example, a measurement provided by conductor subset 1810 may confirm that the remainder of conductive layer 1910 overlying insulating layer 1180 has been substantially completely removed, as indicated by a measured sheet resistance that is higher than a predetermined threshold.

Figure 21:
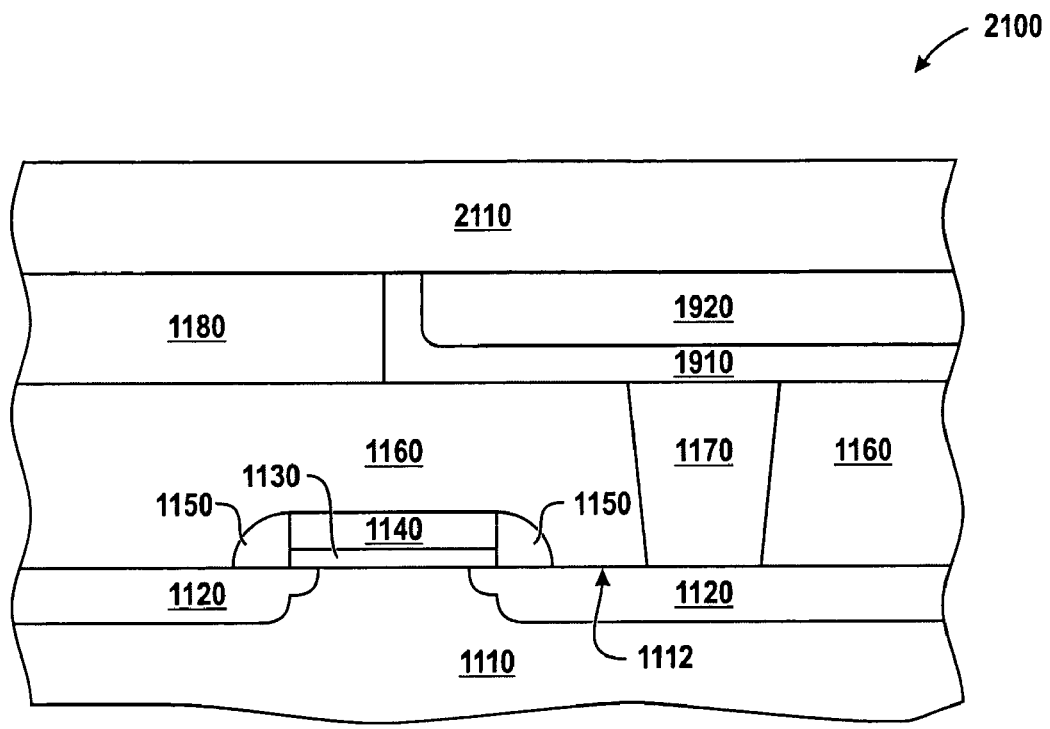
FIG. 21 includes an illustration of a cross sectional view of the workpiece of FIG. 19 after forming a substantially complete electronic device.

FIG. 21 illustrates a cross sectional view of a portion of a substantially complete electronic device 2100. One or more additional interlevel dielectric layers and interconnect levels (not illustrated) can be formed if needed or desired. After the last interconnect level has been formed, a passivation layer 2110 can be formed. Passivation layer 2110 can include one or more insulating films, such as an oxide, a nitride, an oxynitride, or any combination thereof. Bond pad openings can be formed through passivation layer 2110 to expose underlying bond pads. Passivation layer 2110 protects the electronic device from physical damage as well as from chemical contamination.

The use of a probe head and an associated apparatus to monitor and develop a process of forming an electronic device has been described. After reading this specification, skilled artisans will understand that probing can be used at additional stages throughout a device fabrication process. In addition to determining a thickness of a conductive layer or to determine if sufficient material has been formed or removed, other material and process attributes can be determined. For example, inconsistencies in the forming or removing of material at different portions of a workpiece can be evaluated, or defects such as cracks or material contamination can be identified.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a probe apparatus can include a set of conductors and a processor. The set of conductors can be configured to contact a workpiece substantially simultaneously. The processor can be operable to activate a first subset of conductors to determine a four-point-probe parameter, wherein the first subset can be less than the set of conductors. The processor also can be operable to activate a second subset of conductors to determine another four-point-probe parameter. The second subset can be less than the set of conductors and can be different from the first subset. The set of conductors can be configured to remain in contact with the surface of the workpiece during and between activating the first subset and activating the second subset.

In an embodiment of the first aspect, the set of conductors define a probing area of at least 250 cm$^2$. In another embodiment, the set of conductors define a probing area of at least 1100 cm$^2$. In a further embodiment, the first subset of conductors is characterized by a first pitch dimension, and the second subset is characterized by a second pitch dimension that is different from the first pitch dimension. In still another embodiment, the probe apparatus further includes a probe substrate having a primary surface wherein, along a line substantially perpendicular to the primary surface, a void is disposed between the probe substrate and a particular conductor of the set of conductors.

In a second aspect, a process of forming a probe head can include providing a probe substrate that can include conductive leads and can have a primary surface. An insulating layer can be formed over the probe substrate, and the insulating layer can be patterned to expose the conductive leads. Conductors can be formed over the insulating layer and the conductors can define a probing area of at least 250 cm$^2$. Conductive straps can be formed to provide a conductive path between the conductive leads and the conductors.

In an embodiment of the second aspect, the insulating layer is configured to deflect from a shape when a force is applied to the conductors and to return substantially to the shape after the force is removed. In another embodiment, the process further includes forming a sacrificial member before forming the insulating layer. The insulating layer is patterned to expose a portion of the sacrificial member, and the sacrificial member is removed to define a void, wherein the void is disposed between the probe substrate and a particular conductor of the conductors, along a line substantially perpendicular to the primary surface of the probe substrate. In a further embodiment, the conductors define a probing area of at least 1100 cm$^2$. In still another embodiment, an interface to the probe head is provided wherein a first subset of conductors is adapted to facilitate probing a first portion of the workpiece, and wherein a second subset of conductors is adapted to facilitate probing a second portion of the workpiece. A surface of the workpiece and the conductors remain in contact during and between probing using the first subset of conductors and probing using the second subset of conductors. In a particular embodiment, the first subset of the conductors is configured as a four-point probe, and the second subset of the conductors is configured as a different four-point probe.

In a third aspect, a process of forming an electronic device can include contacting a surface of a workpiece using conductors. A first subset of the conductors can be activated to determine a first four-point-probe parameter corresponding to a first local area of the workpiece. A second subset of the conductors can be activated to determine a second four-point-probe parameter corresponding to a second local area of the workpiece. The first subset can be different from the second subset, and the surface of the workpiece and the conductors can remain in contact between activating the first subset of the conductors and activating the second subset of conductors.

In an embodiment of the third aspect, a conductive layer is formed over substantially all of a substrate before contacting the surface of the workpiece, wherein the workpiece includes the conductive layer and the substrate. In a particular embodiment, a thickness of the conductive layer is determined using the first four-point-probe parameter, the second four-point-probe parameter, or a combination of the two four-point-probe parameters. In a more particular embodiment, the conductive layer is thickened after contacting the surface of the workpiece, activating the first subset of the conductors, and activating the second subset of the conductors.

In another embodiment of the third aspect, an insulating layer is formed over a substrate, and a conductive layer is formed over the insulating layer and the substrate. A first portion of the conductive layer is removed to form the surface of the workpiece, and a determination is made regarding whether a sufficient amount of the conductive layer has been removed. In a particular embodiment, determining whether the sufficient amount of the conductive layer has been removed includes determining whether a part of the insulating layer is exposed by using the first four-point-probe parameter, the second four-point-probe parameter, or a combination of the two four-point-probe parameters. In another particular embodiment, a second portion of the conductive layer is removed, a third subset of the conductors is activated to determine a third four-point-probe parameter, and a determination is made regarding whether the sufficient amount of the conductive layer has been removed. In a more particular embodiment, the first and second subsets of the conductors are characterized by a first pitch, and the third and fourth subsets of the conductors are characterized by a second pitch different from the first pitch. In still another embodiment, contacting the surface of the workpiece using conductors includes advancing the conductors towards the workpiece until initial contact with the workpiece occurs, and overdriving the conductors by an additional amount after initial contact between the conductors and the workpiece has occurred.

Note that not all of the activities described above in the general description are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A process of forming a probe head comprising:
   providing a probe substrate including conductive leads and having a primary surface;
   forming an insulating layer over the probe substrate;
   patterning the insulating layer to expose the conductive leads;
   forming, over the insulating layer, conductors that are to contact a surface of a workpiece being tested, wherein the conductors define a probing area of at least 250 cm$^2$; and
   forming straps to provide a conductive path between the conductive leads and the conductors.

2. The process of claim 1, wherein the insulating layer is to deflect from a shape when a force is applied to the conductors and to return substantially to the shape after the force is removed.

3. The process of claim 1, further comprising:
   forming a sacrificial member before forming the insulating layer;
   patterning the insulating layer to expose a portion of the sacrificial member; and
   removing the sacrificial member to define a void, wherein the void is disposed between the probe substrate and a particular conductor of the conductors, along a line substantially perpendicular to the primary surface of the probe substrate.

4. The process of claim 1, wherein:
   forming the conductors over the insulating layer wherein the conductors define a probing area of at least 1100 cm$^2$.

5. The process of claim 1, further comprising:
   providing an interface to the probe head wherein:
      a first subset of the conductors is to facilitate probing a first portion of the workpiece;
      a second subset of the conductors is to facilitate probing a second portion of the workpiece; and
      a surface of the workpiece and the conductors remain in contact during and between probing using the first subset of conductors and probing using the second subset of conductors.

6. The process of claim 5, wherein:
   the first subset of the conductors is configured as a four-point probe; and
   the second subset of the conductors is configured as a different four-point probe.

7. A process of forming an electronic device comprising:
   contacting a surface of a workpiece using conductors;
   activating a first subset of the conductors to determine a first four-point-probe parameter corresponding to a first local area of the workpiece;
   activating a second subset of the conductors to determine a second four-point-probe parameter corresponding to a second local area of the workpiece, wherein:
      the first subset is different from the second subset; and
      the surface of the workpiece and the conductors remain in contact between activating the first subset of the conductors and activating the second subset of the conductors.

8. The process of claim 7, further comprising forming a conductive layer over substantially all of a substrate before contacting the surface of the workpiece, wherein the workpiece includes the conductive layer and the substrate.

9. The process of claim 8, further comprising determining a thickness of the conductive layer, wherein the determination is performed using the first four-point-probe parameter, the second four-point-probe parameter, or a combination thereof.

10. The process of claim 9, further comprising thickening the conductive layer after contacting the surface the workpiece, activating the first subset of the conductors, and activating the second subset of the conductors.

11. The process of claim 7, further comprising:
    forming an insulating layer over a substrate;
    forming a conductive layer over the insulating layer and the substrate;
    removing a first portion of the conductive layer to form the surface of the workpiece; and
    determining whether a sufficient amount of the conductive layer has been removed.

12. The process of claim 11, wherein determining whether the sufficient amount of the conductive layer has been removed comprises determining whether a part of the insulating layer is exposed by using the first four-point-probe parameter, the second four-point-probe parameter, or a combination thereof.

13. The process of claim 11, further comprising:
   removing a second portion of the conductive layer;
   activating a third subset of the conductors to determine a third four-point-probe parameter; and
   determining whether the sufficient amount of the conductive layer has been removed.

14. The process of claim 13, wherein:
   the first and second subsets of the conductors are characterized by a first pitch; and
   the third and fourth subsets of the conductors are characterized by a second pitch different from the first pitch.

15. The process of claim 7, wherein contacting the surface of the workpiece using conductors further comprises:
   advancing the conductors towards the workpiece until initial contact with the workpiece occurs; and
   overdriving the conductors by an additional amount after initial contact between the conductors and the workpiece has occurred.

16. The process of claim 7, wherein the conductors define a probing area of at least 250 cm$^2$.

17. The process of claim 16, further comprising:
   forming a sacrificial member before forming the insulating layer;
   patterning the insulating layer to expose a portion of the sacrificial member; and
   removing the sacrificial member to define a void, wherein the void is disposed between the probe substrate and a particular conductor of the conductors, along a line substantially perpendicular to the primary surface of the probe substrate.

18. The process of claim 16, further comprising:
providing an interface to the probe head wherein:
   a first subset of the conductors is to facilitate probing a first portion of the workpiece;
   a second subset of the conductors is to facilitate probing a second portion of the workpiece; and
   a surface of the workpiece and the conductors remain in contact during and between probing using the first subset of conductors and probing using the second subset of conductors.

19. The process of claim 18, wherein:
the first subset of the conductors is configured as a four-point probe; and
the second subset of the conductors is configured as a different four-point probe.

* * * * *